(12) United States Patent
Xu et al.

(10) Patent No.: US 10,483,375 B1
(45) Date of Patent: Nov. 19, 2019

(54) FIN CUT ETCH PROCESS FOR VERTICAL TRANSISTOR DEVICES

(71) Applicant: INTERNATIONAL BUSINESS MACHINES CORPORATION, Armonk, NY (US)

(72) Inventors: Wenyu Xu, Albany, NY (US); Chen Zhang, Albany, NY (US); Kangguo Cheng, Schenectady, NY (US); Xin Miao, Guilderland, NY (US)

(73) Assignee: International Business Machines Coporation, Armonk, NY (US)

( * ) Notice: Subject to any disclaimer, the term of this patent is extended or adjusted under 35 U.S.C. 154(b) by 0 days.

(21) Appl. No.: 16/037,305

(22) Filed: Jul. 17, 2018

(51) Int. Cl.
| | |
|---|---|
| *H01L 29/66* | (2006.01) |
| *H01L 29/10* | (2006.01) |
| *H01L 29/08* | (2006.01) |
| *H01L 29/417* | (2006.01) |
| *H01L 29/45* | (2006.01) |
| *H01L 29/78* | (2006.01) |
| *H01L 21/306* | (2006.01) |
| *H01L 29/04* | (2006.01) |
| *H01L 21/3105* | (2006.01) |
| *H01L 21/02* | (2006.01) |

(52) U.S. Cl.
CPC .. *H01L 29/66666* (2013.01); *H01L 21/30604* (2013.01); *H01L 29/0847* (2013.01); *H01L 29/1037* (2013.01); *H01L 29/41741* (2013.01); *H01L 29/45* (2013.01); *H01L 29/6656* (2013.01); *H01L 29/7827* (2013.01); *H01L 21/0217* (2013.01); *H01L 21/31053* (2013.01); *H01L 29/045* (2013.01)

(58) Field of Classification Search
CPC ......... H01L 29/66666; H01L 21/30604; H01L 29/7827; H01L 29/45; H01L 29/6656; H01L 29/41741; H01L 29/0847; H01L 29/1037
See application file for complete search history.

(56) References Cited

U.S. PATENT DOCUMENTS

| | | | |
|---|---|---|---|
| 8,569,152 B1 | 10/2013 | Basker et al. | |
| 9,263,287 B2 | 2/2016 | Tsao et al. | |
| 9,318,342 B2 | 4/2016 | Xie et al. | |
| 9,337,318 B2 | 5/2016 | Liu et al. | |
| 9,412,822 B2 * | 8/2016 | Cai | ..................... H01L 29/1054 |
| 9,418,900 B1 * | 8/2016 | He | ................. H01L 21/823878 |
| 9,520,500 B1 * | 12/2016 | Ok | ........................ H01L 29/785 |
| 9,543,301 B2 | 1/2017 | Huang et al. | |
| 9,606,432 B2 * | 3/2017 | Ning | ....................... G03F 7/094 |
| 9,620,590 B1 * | 4/2017 | Bergendahl | ......... H01L 29/0673 |
| 9,634,125 B2 * | 4/2017 | Wu | ................... H01L 29/66795 |

(Continued)

*Primary Examiner* — John P. Dulka
(74) *Attorney, Agent, or Firm* — Tutunjian & Bitetto, P.C.; Vazken Alexanian

(57) ABSTRACT

A method for fabricating a semiconductor device including a vertical transistor includes forming a fin structure from a substrate. The fin structure includes a fin. The method further includes forming a bottom source/drain region on the substrate adjacent to the fin, etching a longitudinal end portion of the fin to create a gap exposing the substrate, forming a gate and a top source/drain region, and forming a contact wrapping around a horizontal portion and a vertical portion of the bottom source/drain region in a region including a location where the longitudinal end portion of the fin was removed by the etching.

20 Claims, 7 Drawing Sheets

(56) References Cited

U.S. PATENT DOCUMENTS

| | | | |
|---|---|---|---|
| 9,691,765 B1* | 6/2017 | Bi | H01L 27/0886 |
| 9,704,856 B1* | 7/2017 | Cheng | H01L 27/0629 |
| 9,735,060 B1 | 8/2017 | Sung et al. | |
| 9,754,792 B1 | 9/2017 | Derderian | |
| 9,768,072 B1* | 9/2017 | Cheng | H01L 21/82348 |
| 9,859,166 B1* | 1/2018 | Cheng | H01L 21/82348 |
| 9,892,961 B1* | 2/2018 | Cheng | H01L 21/0217 |
| 9,991,254 B1* | 6/2018 | Cheng | H01L 21/02532 |
| 2014/0246731 A1* | 9/2014 | Chen | H01L 21/823481 257/386 |
| 2014/0284667 A1* | 9/2014 | Basker | H01L 29/6681 257/288 |
| 2015/0076609 A1* | 3/2015 | Xie | H01L 29/785 257/365 |
| 2016/0190242 A1 | 6/2016 | Ching et al. | |
| 2016/0351411 A1* | 12/2016 | Xie | H01L 21/3083 |
| 2017/0084497 A1* | 3/2017 | Lee | H01L 29/20 |
| 2017/0103981 A1 | 4/2017 | Hung et al. | |
| 2017/0178960 A1* | 6/2017 | Basker | H01L 27/0886 |
| 2017/0263575 A1* | 9/2017 | Cao | G06F 21/44 |
| 2017/0352751 A1* | 12/2017 | Cao | H01L 29/7613 |
| 2017/0358660 A1* | 12/2017 | Cheng | H01L 29/66666 |
| 2018/0076225 A1* | 3/2018 | Bergendahl | H01L 27/1207 |
| 2018/0145169 A1* | 5/2018 | Chang | H01L 21/0228 |
| 2018/0197886 A1* | 7/2018 | Cheng | H01L 27/1211 |
| 2018/0290645 A1* | 10/2018 | Zhao | B60W 30/143 |
| 2018/0331104 A1* | 11/2018 | Bi | H01L 27/0924 |
| 2019/0013413 A1* | 1/2019 | Yang | H01L 21/3081 |
| 2019/0079048 A1* | 3/2019 | Cheng | G01N 27/44791 |
| 2019/0081155 A1* | 3/2019 | Xie | H01L 29/66553 |
| 2019/0122937 A1* | 4/2019 | Cheng | H01L 21/02532 |
| 2019/0157267 A1* | 5/2019 | Cheng | H01L 27/0886 |
| 2019/0157390 A1* | 5/2019 | Yeung | H01L 29/0665 |
| 2019/0157391 A1* | 5/2019 | Yeung | H01L 29/0665 |
| 2019/0157404 A1* | 5/2019 | Cheng | H01L 29/41775 |
| 2019/0157420 A1* | 5/2019 | Cheng | H01L 29/6656 |
| 2019/0157427 A1* | 5/2019 | Li | H01L 29/66666 |

* cited by examiner

FIN CUT ETCH PROCESS FOR VERTICAL TRANSISTOR DEVICES

BACKGROUND

Technical Field

The present invention generally relates to semiconductor devices, and more particularly to vertical transistor devices and methods of fabricating the same.

Description of the Related Art

A fin type field effect transistor (finFET) is a type of metal-oxide-semiconductor field-effect transistor (MOSFET). FinFET devices include an arrangement of fins formed from a semiconductor material disposed on a substrate. A gate stack is arranged over the fins to define a channel region of the fins, while regions of the fins extending outwardly from the channel region define active source and drain regions of the device. A vertical transistor, such as a vertical transport fin field-effect transistor (VTFET), is a finFET transistor in which the source and drain regions are positioned vertically with respect to the fin such that current runs vertically between the source and drain regions. Also, the gate of a vertical transistor can wrap around a fin.

SUMMARY

In accordance an embodiment of the present invention, a method for fabricating a semiconductor device including a vertical transistor is provided. The method includes forming a fin structure from a substrate. The fin structure includes a fin. The method further includes forming a bottom source/drain region on the substrate adjacent to the fin, etching a longitudinal end portion of the fin to create a gap exposing the substrate, forming a gate and a top source/drain region, and forming a contact wrapping around a horizontal portion and a vertical portion of the bottom source/drain region in a region including a location where the longitudinal end portion of the fin was removed by the etching.

In accordance another embodiment of the present invention, a method for fabricating a semiconductor device including a vertical transistor is provided. The method includes forming a fin structure from a substrate. The fin structure includes a fin and a cap layer disposed on the fin. The method further includes forming a bottom source/drain region on the substrate adjacent to the fin. The cap layer protects sidewalls of the fin during the formation of the bottom source/drain region. The method further includes forming a first dielectric fill on the substrate after defining an active diffusion cut region, etching a longitudinal end portion of the fin to create a gap exposing the substrate, filling the gap with a second dielectric fill, forming a gate and a top source/drain region, and forming a contact wrapping around a horizontal portion and a vertical portion of the bottom source/drain region in a region including a location where the longitudinal end portion of the fin was removed by the etching.

In accordance with yet another embodiment of the present invention, a semiconductor device including a vertical transistor is provided. The device includes a substrate, a fin disposed on the substrate, a bottom source/drain region disposed on the substrate adjacent to the fin, a bottom spacer disposed on the bottom source/drain region, a gate stack adjacent to the fin disposed on the bottom spacer, a top spacer disposed on the gate stack, a top source/drain region disposed on the top spacer and the fin, and a contact wrapping around a horizontal portion and a vertical portion of the bottom source/drain region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
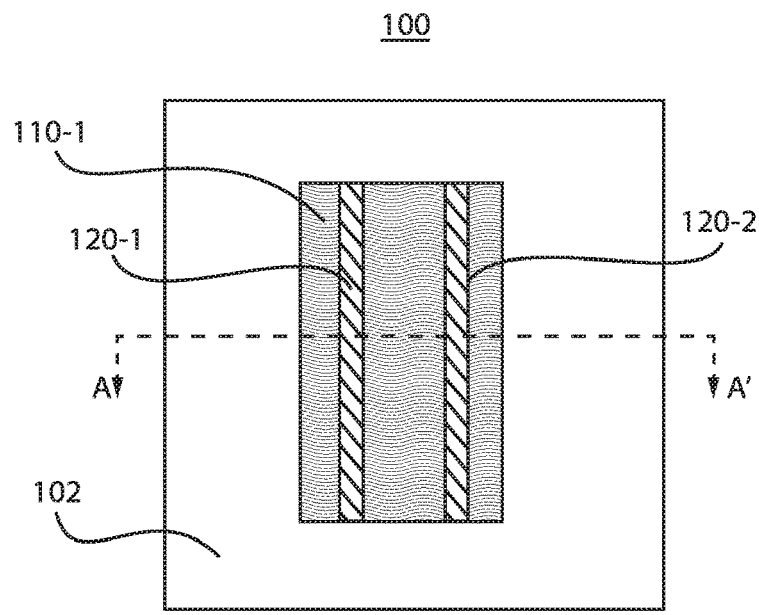
FIG. 1 is a top-down view showing the formation of fins and a bottom source/drain region, and the definition of an active diffusion region during the fabrication of a semiconductor device, in accordance with an embodiment of the present invention.

Aspects of the present embodiments provide for a fin cut last approach that can reduce the size of the active diffusion region of a vertical transistor (e.g., vertical transport fin field-effect transistor (VTFET)) while maintaining a good contact area for at least one contact (e.g., a trench silicide contact) to land. The fin cut can be performed in the middle of an active diffusion region oxide fill after oxide planarization (e.g., chemical-mechanical planarization or CMP). Additionally, the bottom source/drain of the vertical transistor can have a trench shape and the at least one contact can have a three-dimensional (3D) wrap-around shape to enlarge the contact area. For example, the at least one contact can wrap-around an end of the bottom source/drain region.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 2:
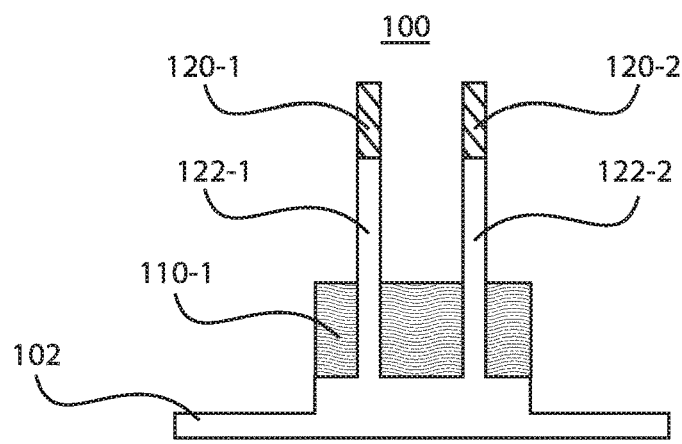
FIG. 2 is a cross-sectional view showing the semiconductor device shown in FIG. 1, in accordance with an embodiment of the present invention.

Referring now to the drawings in which like numerals represent the same or similar elements, FIG. 1 shows a top-down view of a semiconductor device 100 including a vertical transistor device in accordance with an illustrative embodiment, and FIG. 2 shows a cross-sectional view taken through line "A-A'" of the device 100 shown in FIG. 1.

As shown in FIGS. 1 and 2, the device 100 includes a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown in FIGS. 1 and 2, a plurality of fin structures is formed from the substrate 102. In this illustrative embodiment, two fin structures are shown. In this top down view, cap layers 120-1 and 120-2 of the fin structures are shown. However, as shown in FIG. 2, the cap layers 120-1 and 120-1 are formed on respective semiconductor fins ("fins") 122-1 and 122-2 of the fin structures.

The cap layers 120-1 and 120-2 can include a dielectric material that functions to protect the fins 122-1 and 122-2 during the formation of a bottom source/drain region 110-1 on the substrate 102 adjacent to the fins 122-1 and 122-2. The cap layers 120-1 and 120-2 can include any suitable material in accordance with the embodiments described herein. For example, the cap layers 120-1 and 120-2 can include a silicon nitride (e.g., SiN).

The bottom source/drain region 110-1 can be formed using any suitable process in accordance with the embodiments described herein. For example, the bottom source/drain region 110-1 can be epitaxially grown on the substrate 102.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

After the bottom source/drain region 110-1 is formed, an active diffusion cut region is defined from the fins 122-1 and 122-2 and the bottom source/drain region 110-1 by performing an active diffusion cut.

Figure 3:
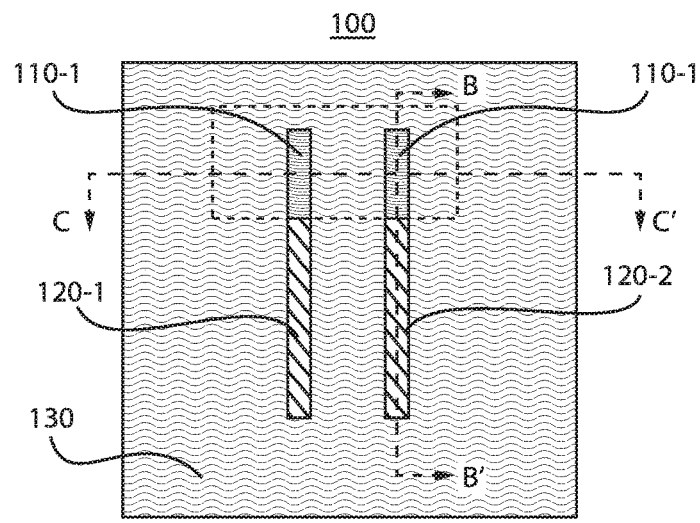
FIG. 3 is a top-down view showing the formation of a dielectric fill and a fin cut process performed during the fabrication of the semiconductor device, in accordance with an embodiment of the present invention.
Figure 4:
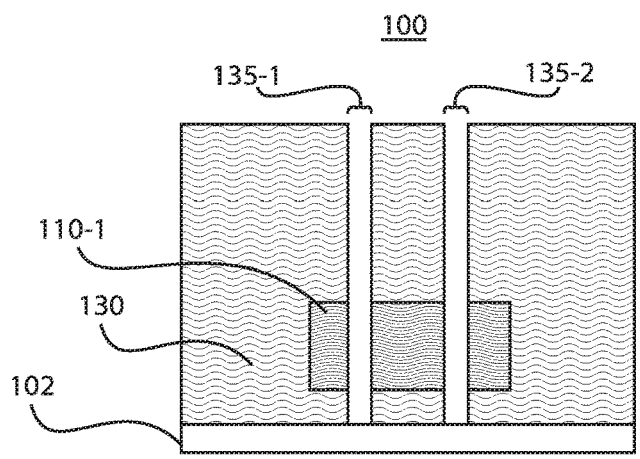
FIG. 4 is one cross-sectional view n of the semiconductor device shown in FIG. 3, in accordance with an embodiment of the present invention.
Figure 5:
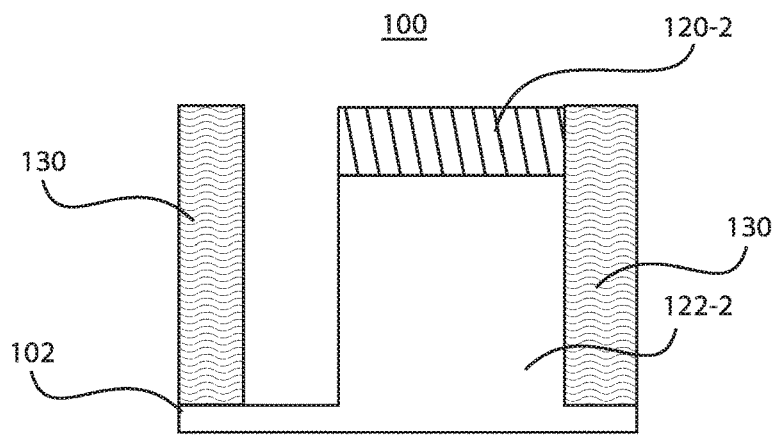
FIG. 5 is another cross-sectional view of the semiconductor device shown in FIG. 3, in accordance with an embodiment of the present invention.

FIG. 3 shows a top-down view of the device 100 in accordance with an illustrative embodiment, FIG. 4 shows a cross-sectional view taken through line "C-C'" of the device 100 shown in FIG. 3, and FIG. 5 shows a cross-sectional view taken through line "B-B'" of the device 100 shown in FIG. 3.

As shown in FIGS. 3-5, a dielectric fill 130 is formed on the substrate 102. The dielectric fill 130 can include any suitable material in accordance with the embodiments described herein. For example, the dielectric fill 130 can include e.g., an oxide material. A planarization process, such as chemical-mechanical planarization (CMP), can be performed after the dielectric fill 130 is formed, and the planarization process can stop at the cap layers 120-1 and 120-2.

As further shown in FIGS. 3-5, longitudinal end portions of the fin structures are removed by employing a fin cut etch process. The fin cut etch process can be performed in a middle region of the dielectric fill 130 and by utilizing a fin cut etch mask. The fin cut process can etch the fin structures, and not the surrounding dielectric fill 130. The fin cut etch process creates gaps 135 exposing the substrate 102.

Figure 6:
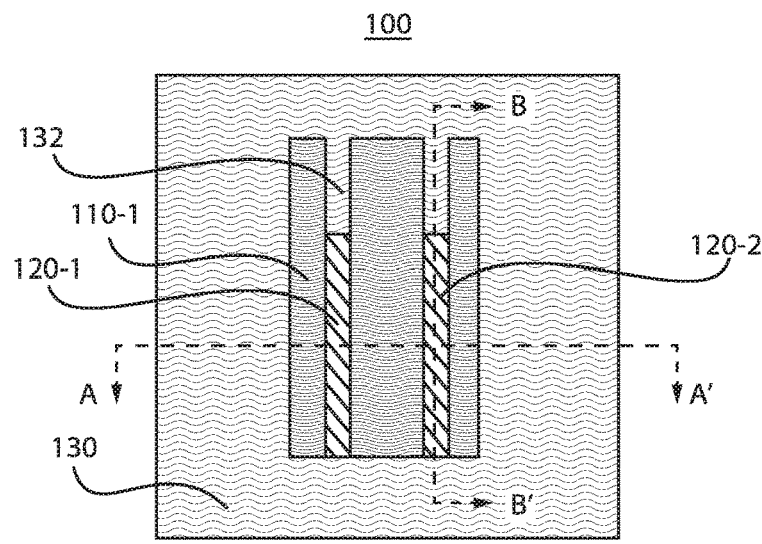
FIG. 6 is a top-down view showing a fin reveal process performed during the fabrication of the semiconductor device, in accordance with an embodiment of the present invention.
Figure 7:
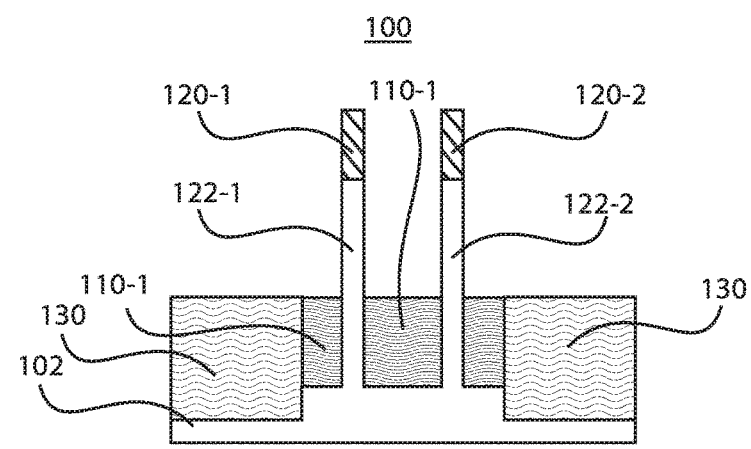
FIG. 7 is one cross-sectional view of the semiconductor device of FIG. 6, in accordance with an embodiment of the present invention.
Figure 8:
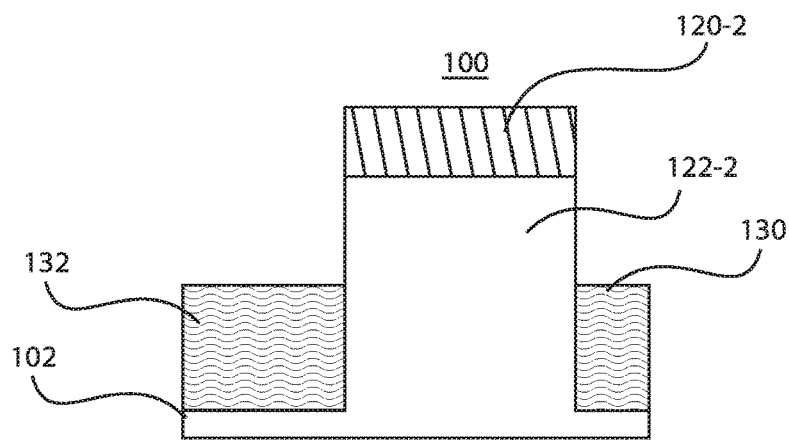
FIG. 8 is another cross-sectional view of the semiconductor device of FIG. 6, in accordance with an embodiment of the present invention.

FIG. 6 shows a top-down view of the device 100 in accordance with an illustrative embodiment, FIG. 7 shows a cross-sectional view taken through line "A-A'" of the the device 100 shown in FIG. 6, and FIG. 8 shows a cross-sectional view taken through line "B-B'" of the device 100 shown in FIG. 6.

As shown in FIGS. 6-8, the gaps 135 are filled with dielectric fill 132 and a planarization process (e.g., CMP) can be performed. The dielectric fill 132 can include any suitable material in accordance with the embodiments described herein. For example, the dielectric fill 132 can include e.g., an oxide material. The dielectric fill 132 can include the same material as the dielectric fill 130, or a different material than the dielectric fill 130.

As further shown in FIGS. 6-8, the dielectric fills 130 and 132 are recessed to reveal the fins 122-1 and 122-2. Any suitable process can be used performing the recessing in accordance with the embodiments described herein.

Figure 9:
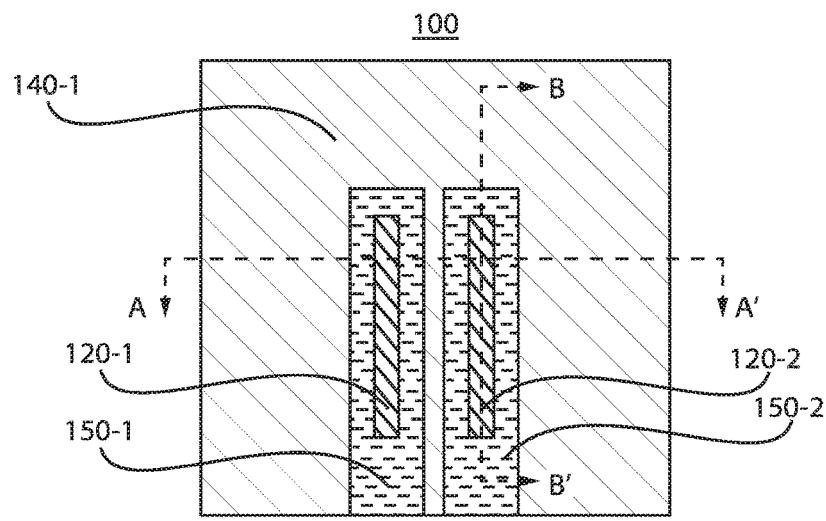
FIG. 9 is a top-down view showing the formation of a bottom spacer and gate stacks during the fabrication of the semiconductor device, in accordance with an embodiment of the present invention.
Figure 10:
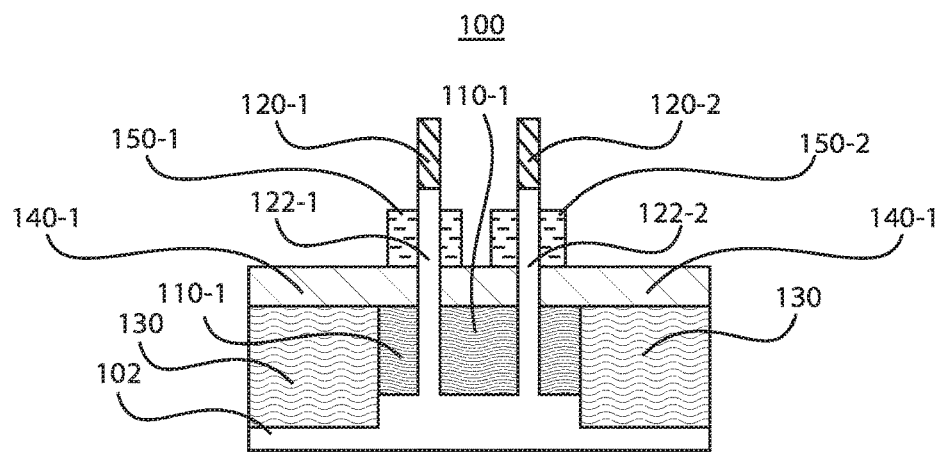
FIG. 10 is one cross-sectional view of the semiconductor device of FIG. 9, in accordance with an embodiment of the present invention.
Figure 11:
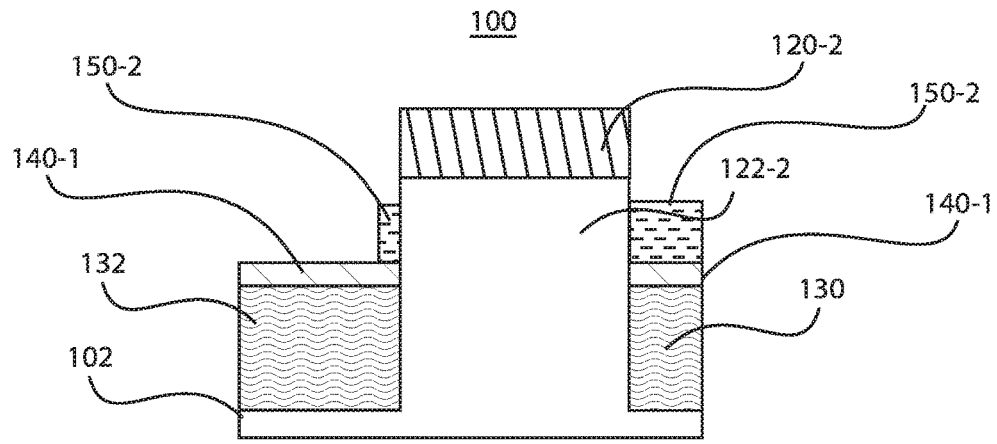
FIG. 11 is another cross-sectional view of the semiconductor device of FIG. 9, in accordance with an embodiment of the present invention.

FIG. 9 shows a top-down view of the device 100 in accordance with an illustrative embodiment, FIG. 10 shows a cross-sectional view taken through line "A-A'" of the device 100 shown in FIG. 9, and FIG. 11 shows a cross-sectional view taken through line "B-B'" of the device 100 shown in FIG. 9.

As shown in FIGS. 9-11, a bottom spacer 140-1 is formed. The bottom spacer 140-1 can include any suitable dielectric material in accordance with the embodiments described herein. For example, the bottom spacer 140-1 can include an oxide, a nitride, an oxynitride, etc.

As further shown in FIGS. 9-11, a gate stack 150-1 corresponding to the fin 122-1 and a gate stack 150-2 corresponding to the fin 122-2 are formed on the spacer 140-1. The gate stacks 150-1 and 150-2 can illustratively include a gate dielectric material and a gate conductor material (e.g., work function metal). The gate dielectric material can include a high-k dielectric material, although any type of dielectric material can be used in accordance with the embodiments described herein.

A high-k dielectric material is a dielectric material having a dielectric constant (k) higher than the dielectric constant of silicon dioxide ($SiO_2$) at room temperature (e.g., about 20° C.-25° C.) and atmospheric pressure (about 1 atm). Some examples of high-k dielectric materials suitable for the dielectric layer 120 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the high-k gate dielectric layer 15 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof.

Figure 12:
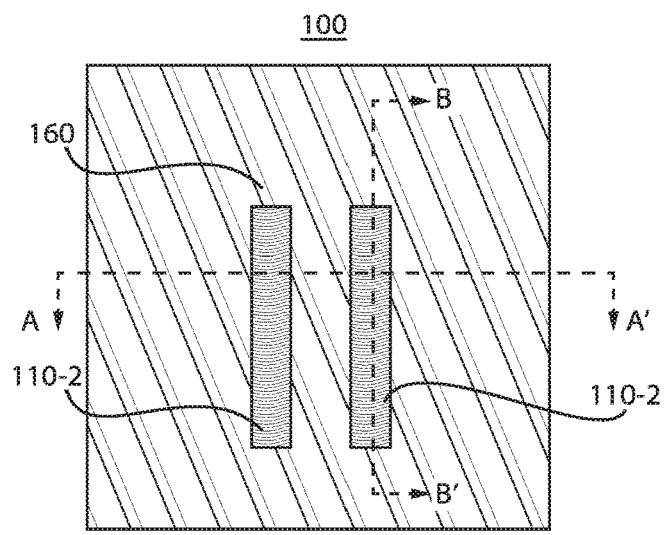
FIG. 12 is a top-down view showing the formation of a top spacer and top source/drain regions during the fabrication of the semiconductor device, in accordance with an embodiment of the present invention.
Figure 13:
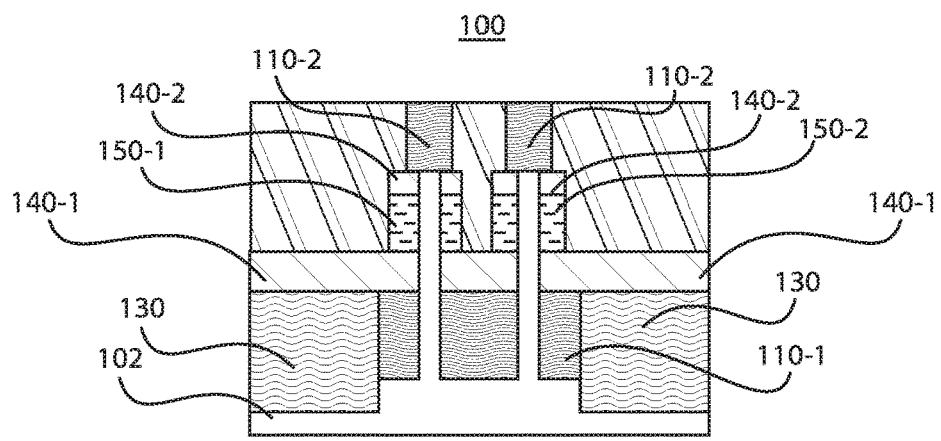
FIG. 13 is one cross-sectional view of the semiconductor device of FIG. 12, in accordance with an embodiment of the present invention.
Figure 14:
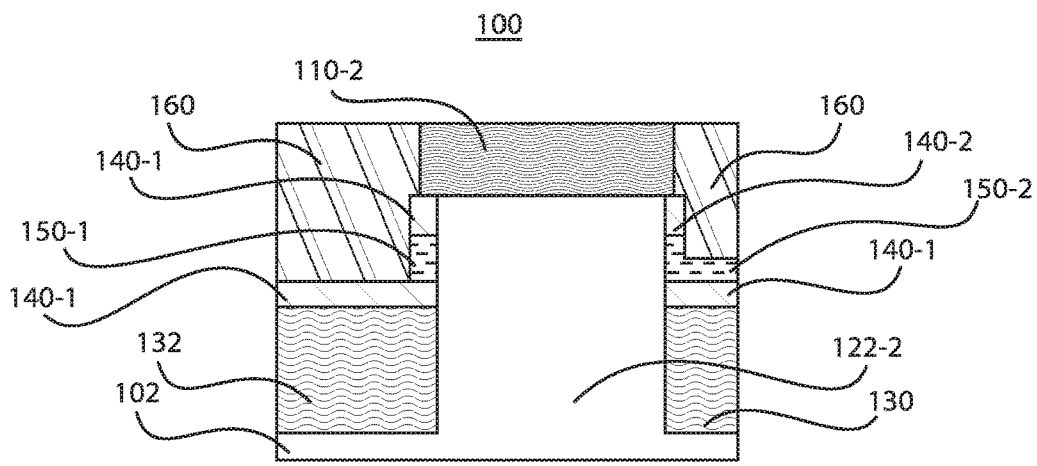
FIG. 14 is another cross-sectional view of the semiconductor device of FIG. 12, in accordance with an embodiment of the present invention.

FIG. 12 shows a top-down view of the device 100 in accordance with an illustrative embodiment, FIG. 13 shows a cross-sectional view taken through line "A-A'" of the device 100 shown in FIG. 12, and FIG. 14 shows a cross-sectional view taken through line "B-B'" of the device 100 shown in FIG. 12.

As shown in FIGS. 12-14, the cap layers 120-1 and 120-2 are removed, and a top spacer 140-2 is formed on the gate stacks 150-1 and 150-2. The top spacer 140-2 can include any suitable dielectric material in accordance with the embodiments described herein. For example, the top spacer 140-2 can include an oxide, a nitride, an oxynitride, etc. The top spacer 140-2 can include the same material as the bottom spacer 140-1, or a different material than the bottom spacer 140-1.

As further shown in FIGS. 12-14, a top source/drain region 110-2 can be formed using any suitable process in accordance with the embodiments described herein. For example, the top source/drain region 110-2 can be formed via epitaxial growth.

As further shown in FIGS. 12-14, dielectric fill 160 is formed. The dielectric fill 160 can include any suitable material in accordance with the embodiments described herein. For example, the dielectric fill 160 can include e.g., an oxide material. The dielectric fill 160 can include the same dielectric material as dielectric fill 130 and/or dielectric fill 132, or a different suitable dielectric material. A planarization process, such as chemical-mechanical planarization (CMP), can be performed after the dielectric fill 160 is formed.

Figure 15:
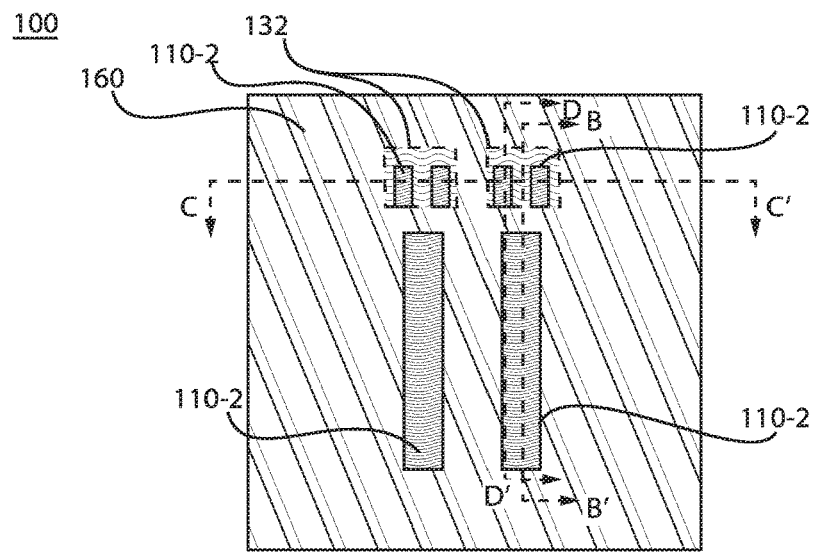
FIG. 15 is a top-down view showing the formation of trenches during the fabrication of the semiconductor device, in accordance with an embodiment of the present invention.
Figure 16:
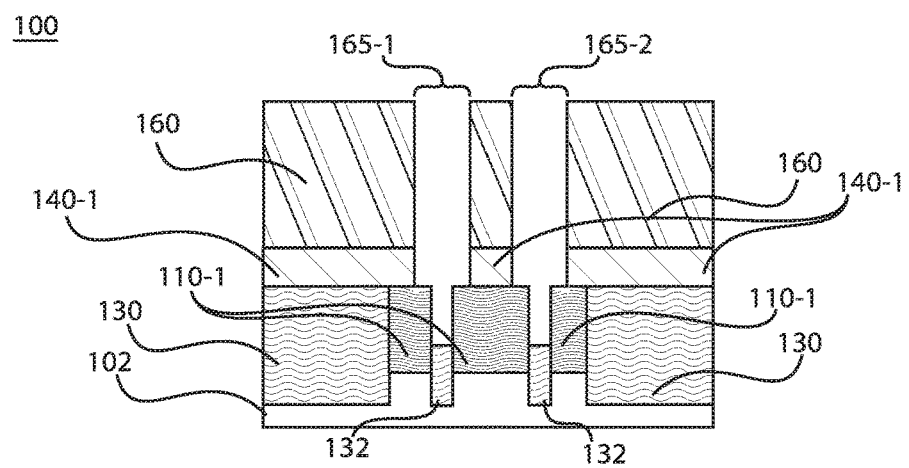
FIG. 16 is one cross-sectional view of the semiconductor device of FIG. 15, in accordance with an embodiment of the present invention.
Figure 17:
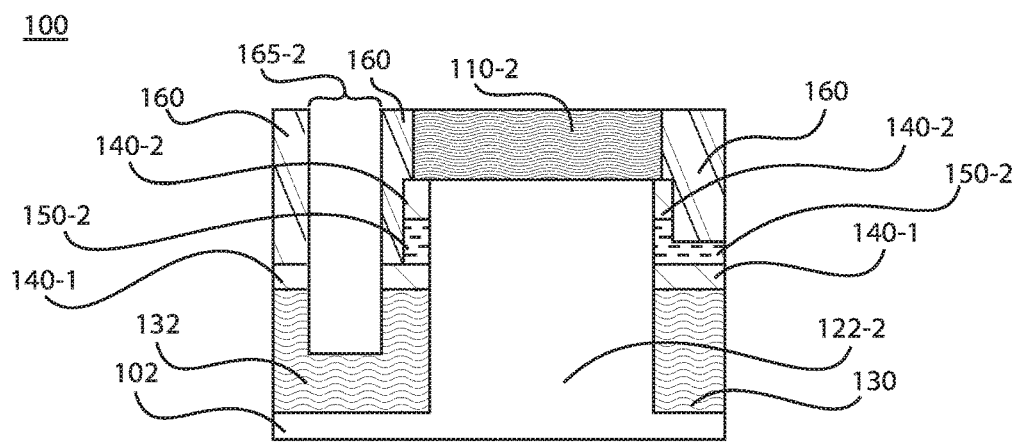
FIG. 17 is another cross-sectional view of the semiconductor device of FIG. 15, in accordance with an embodiment of the present invention.
Figure 18:
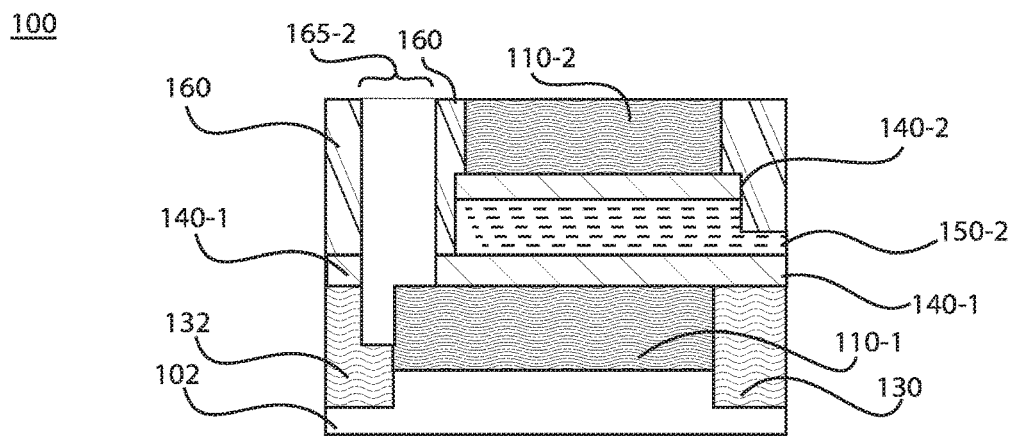
FIG. 18 is yet another cross-sectional view of the semiconductor device of FIG. 15, in accordance with an embodiment of the present invention.

FIG. 15 shows a top-down view of the device 100 in accordance with an illustrative embodiment, FIG. 16 shows a cross-sectional view taken through line "C-C'" of the device 100 shown in FIG. 15, FIG. 17 shows a cross-sectional view taken through line "B-B'" of the device 100 shown in FIG. 15, and FIG. 18 shows a cross-sectional view taken through line "D-D'" of the device 100 shown in FIG. 15.

As shown in FIGS. 15-18, trenches 165-1 and 165-2 for contact formation are formed. In one embodiment, the trenches 165-1 and 165-2 can be formed by using a first etching to expose the bottom spacer 140-1, and using a second etching to break through the bottom spacer 140-1 and recess the dielectric material to create the trenches 165-1 and 165-2. In one embodiment, the second etching uses a timed etch process.

As can be seen in FIG. 18, which shows a cross-section of the device 100 taken through the gate stack 150-2 on the sidewall of the fin 122-2 and the bottom source/drain region 110-1 after the trench 165-2 is formed, the trench 165-2 is shown having a portion above the bottom source/drain region 110-1, and a portion extending past the bottom source/drain region 110-1 to a position between the bottom surface and the top surface of the bottom/source region 110-1. The trench 165-2 is able to be formed by virtue of the fin cut process described above with reference to FIGS. 3-5.

Figure 19:
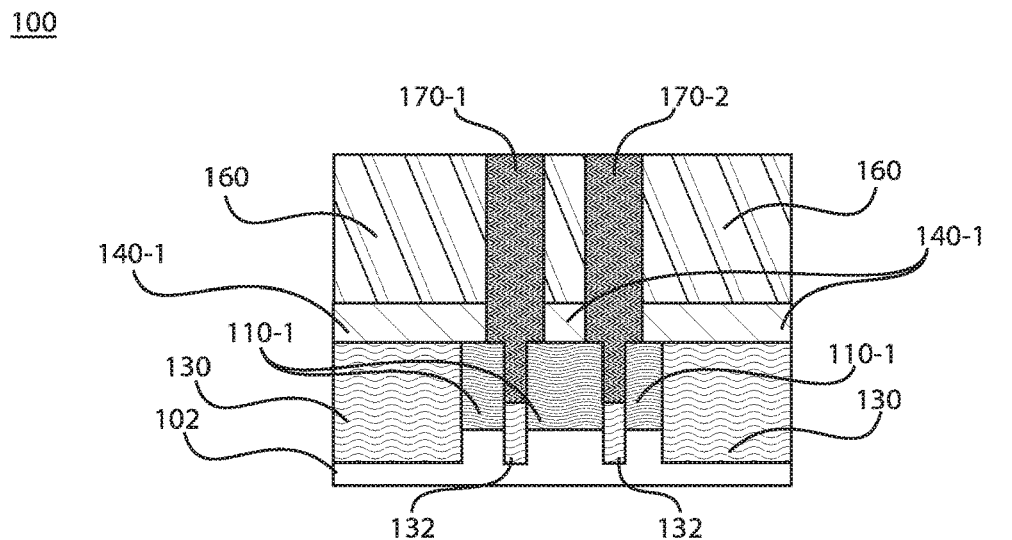
FIG. 19 is a cross-sectional view of contacts formed in the trenches shown in FIG. 16 during the fabrication of the semiconductor device, in accordance with yet another embodiment of the present invention.

Referring to FIG. 19, conductive material is formed in the trenches 165-1 and 165-2 to create contacts 170-1 and 170-2, respectively. In one embodiment, the conductive material formed in the trenches 165-1 and 165-2 to create the contacts 170-1 and 170-2 includes a trench silicide, and the contacts 170-1 and 170-2 include trench silicide (TS) contacts. However, the conductive material formed in the trenches to create the contacts 170-1 and 170-2 can include any suitable material in accordance with the embodiments described herein. The contacts 170-1 and 170-2 illustratively have a 3D wrap-around shape to enlarge the contact area. In one embodiment, the contacts 170-1 and 170-2 wrap-around an end of the bottom source/drain region 110-1. Further details regarding the contact 170-2 will now be described with reference to FIG. 20.

Figure 20:
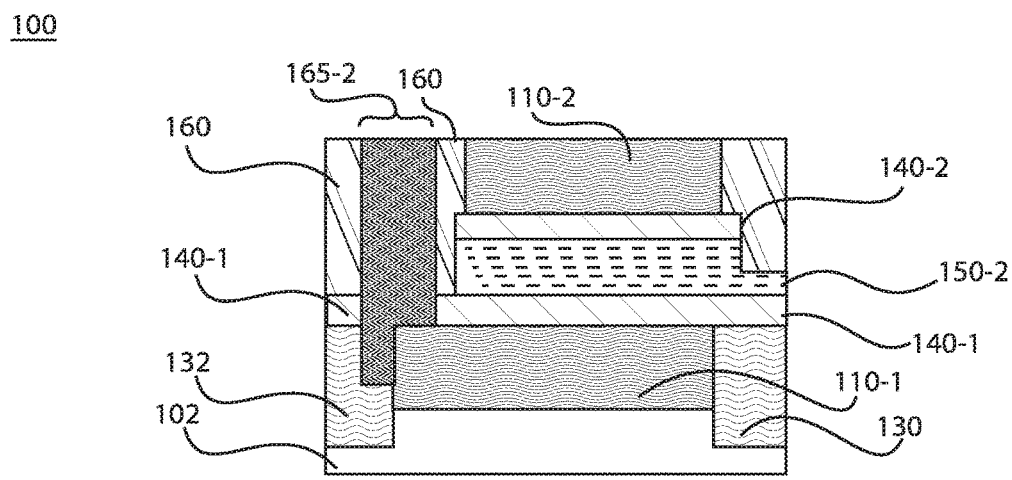
FIG. 20 is another cross-sectional view of contacts formed in the trenches shown in FIG. 18 during the fabrication of the semiconductor device, in accordance with yet another embodiment of the present invention.

Referring to FIG. 20, which shows a cross-section of the device 100 taken through the gate stack 150-2 on the sidewall of the fin 122-2 and the bottom source/drain region 110-1 after the trench 165-2 is filled with conductive material to form the contact 170-2, the contact 170-2 is shown being formed along a portion of the top surface of the bottom source/drain region 110-1, and along a portion of a side surface of the bottom source/drain region 110-1. Accordingly, the contact 170-2 wraps around a horizontal portion and a vertical portion of the bottom source/drain region in a region including a location where the longitudinal end portion of the fin was removed by the etching (e.g., the contact 170-22 has a three-dimensional wrap around shape).

The illustrative embodiments described above with reference to FIGS. 1-20 allow for the formation of smaller active diffusion regions for vertical transistors by wrapping contacts around ends of the bottom source/drain regions, thereby increasing the contact area to the bottom source/drain regions and maintaining good contact area for the contacts to land. More specifically, the contacts result from a fin cut approach (e.g., a fin cut last approach), which can be performed in the middle of an active diffusion region dielectric fill, that allows for the formation of trenches that promote the wrap-around property of the contacts relative to the bottom source/drain regions.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device including a vertical transistor, comprising:
   forming a fin structure from a substrate, the fin structure including a fin;
   forming a bottom source/drain region on the substrate adjacent to the fin;
   etching a longitudinal end portion of the fin to create a gap exposing the substrate;
   forming a gate and a top source/drain region; and
   forming a contact wrapping around a horizontal portion and a vertical portion of the bottom source/drain region in a region including a location where the longitudinal end portion of the fin was removed by the etching.

2. The method of claim 1, wherein the fin structure further includes a cap layer disposed on the fin to protect the sidewalls of the fin during the formation of the bottom source/drain region.

3. The method of claim 1, further comprising forming a bottom spacer on the bottom source/drain region, wherein the gate stack is formed on the bottom spacer.

4. The method of claim 3, further comprising forming a top spacer on the gate stack, wherein the top source/drain region is formed on the top spacer and the fin.

5. The method of claim 1, further comprising etching material in the region including the location where the longitudinal end portion of the fin was removed by the etching to form a trench, and filling the trench with conductive material to form the contact.

6. The method of claim 5, wherein etching the material in the region including the location where the longitudinal end portion of the fin was removed by the etching to form the trench includes a first etching to expose the bottom spacer, and a second etching to break through the bottom spacer and recess dielectric material corresponding to the trench to expose a side wall of the bottom source/drain region within the trench.

7. The method of claim 6, wherein the second etching uses a timed etch process.

8. The method of claim 1, wherein the contact includes trench silicide.

9. The method of claim 1, wherein the contact has a three-dimensional wrap-around shape.

10. A method for fabricating a semiconductor device including a vertical transistor, comprising:
    forming a fin structure from a substrate, the fin structure including a fin and a cap layer disposed on the fin;
    forming a bottom source/drain region on the substrate adjacent to the fin, wherein the cap layer protects sidewalls of the fin during the formation of the bottom source/drain region;
    forming a first dielectric fill on the substrate after defining an active diffusion cut region;
    etching a longitudinal end portion of the fin to create a gap exposing the substrate;
    filling the gap with a second dielectric fill;
    forming a gate and a top source/drain region; and
    forming a contact wrapping around a horizontal portion and a vertical portion of the bottom source/drain region in a region including a location where the longitudinal end portion of the fin was removed by the etching.

11. The method of claim 10, further comprising forming a bottom spacer on the bottom source/drain region, wherein the gate stack is formed on the bottom spacer.

12. The method of claim 11, further comprising forming a top spacer on the gate stack, wherein the top source/drain region is formed on the top spacer and the fin.

13. The method of claim 10, further comprising etching material in the region including the location where the longitudinal end portion of the fin was removed by the etching to form a trench, and filling the trench with conductive material to form the contact.

14. The method of claim 13, wherein etching the material in the region including the location where the longitudinal end portion of the fin was removed by the etching to form the trench includes a first etching to expose the bottom spacer, and a second etching to break through the bottom spacer and recess dielectric material corresponding to the trench to expose a side wall of the bottom source/drain region within the trench.

15. The method of claim 14, wherein the second etching uses a timed etch process.

16. The method of claim 10, wherein the contact includes trench silicide.

17. The method of claim 10, wherein the at least one contact has a three-dimensional wrap-around shape.

18. A semiconductor device including a vertical transistor, comprising:
    a substrate;
    a fin disposed on the substrate;
    a bottom source/drain region disposed on the substrate adjacent to the fin;
    a bottom spacer disposed on the bottom source/drain region;
    a gate stack adjacent to the fin disposed on the bottom spacer;
    a top spacer disposed on the gate stack;
    a top source/drain region disposed on the top spacer and the fin; and
    a contact wrapping around a horizontal portion and a vertical portion of the bottom source/drain region.

19. The device of claim 18, wherein contact includes trench silicide.

20. The device of claim 18, wherein the contact has a three-dimensional wrap-around shape.

* * * * *